United States Patent
Suzawa

(10) Patent No.: US 8,704,573 B2
(45) Date of Patent: Apr. 22, 2014

(54) DATA LATCH CIRCUIT

(75) Inventor: Hideyuki Suzawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 231 days.

(21) Appl. No.: 13/107,478

(22) Filed: May 13, 2011

(65) Prior Publication Data

US 2011/0285443 A1    Nov. 24, 2011

(30) Foreign Application Priority Data

May 20, 2010    (JP) .................................. 2010-116152

(51) Int. Cl.
*H03K 3/00* (2006.01)
(52) U.S. Cl.
USPC .......................................... 327/199; 375/362
(58) Field of Classification Search
USPC ........... 327/199; 375/362, 354, 355, 375, 376
See application file for complete search history.

(56) References Cited

U.S. PATENT DOCUMENTS 7,912,169 B2 *    3/2011    Saeki et al. .................... 375/362
2006/0050827 A1 *    3/2006    Saeki et al. .................... 375/362

* cited by examiner

*Primary Examiner* — Lincoln Donovan
*Assistant Examiner* — Diana J Cheng
(74) *Attorney, Agent, or Firm* — Ladas & Parry, LLP

(57) ABSTRACT

A serial-format data signal is input to a data input terminal. Each of n (n represents an integer of two or more) multiple clock input terminals is configured to receive a clock signal as an input signal. An input flip-flop latches the data signal at each timing that corresponds to the corresponding clock signal. A serial/parallel converter converts the serial-format data signal into a parallel-format intermediate data signal using the corresponding clock signal. A data selector selects one from among the n intermediate data signals according to a selection signal.

8 Claims, 5 Drawing Sheets

DATA LATCH CIRCUIT

CROSS-REFERENCE TO RELATED APPLICATIONS

This application claims priority to Japanese Patent Application No. 2010-116152 filed on May 20, 2010 the disclosure of which is incorporated herein by reference.

BACKGROUND OF THE INVENTION

1. Field of the Invention

The present invention relates to a data latch circuit configured to latch a data signal using one clock signal selected from among multiple clock signals.

2. Description of the Related Art

A semiconductor test apparatus (which will be referred to simply as the "test apparatus" hereafter) is used to test whether or not a device under test operates normally. Such a test apparatus acquires the level of a data signal at each edge timing of a clock signal that is synchronized with the data signal so as to acquire the value of the data signal. The test apparatus judges whether or not the value of the data signal thus acquired matches an expected value so as to judge the quality of the device under test, or so as to identify defective parts.

There are various kinds of known signal formats used as an output signal of a semiconductor device. FIGS. 1A and 1B are diagrams each showing an example configuration of a test system.

A device under test (DUT) 1 shown in FIG. 1A outputs multiple data signals D1 and D2 and clock signals CLK1 and CLK2 that correspond to the multiple data signals D1 and D2 in a one-to-one manner. The data signals D1 and D2 are synchronized with the edges of the respective clock signals CLK1 and CLK2.

A test apparatus 2a includes multiple test pins P1 through P4 connected to device pins of a DUT1a in a one-to-one manner, and includes circuit blocks which will be referred to as the pin electronics circuits PE1 through PE4 which are respectively provided to the test pins P1 through P4. Each pin electronics circuit PE includes a driver configured to output a signal to the DUT 1 or a comparator configured to judge the level of the data signal received from the device under test.

With a test system shown in FIG. 1A, the pin electronics circuit PE1 connected to the first pin P1 latches the data signal D1 at an edge timing of the clock signal CLK1 input to the second pin P2. In the same way, the pin electronics circuit PE3 connected to the third pin P3 latches the data signal D2 at an edge timing of the clock signal CLK2 input to the fourth pin P4.

With a test system shown in FIG. 1B, a DUT1b outputs multiple data signals $D1_1$ and $D1_2$ and a their common clock signal CLK1. The data signals $D1_1$ and $D1_2$ are synchronized with an edge of the common clock signal CLK1. With such a system, the pin electronics circuit PE1 connected to the first pin latches the data signal $D1_1$ at an edge timing of the clock signal CLK1 input to the third pin P3. Furthermore, the pin electronics circuit PE2 circuit connected to the second pin latches the data signal $D1_2$ at an edge timing of the clock signal CLK1 input to the third pin P3.

Such a test apparatus is required to have the versatility to support various kinds of DUTs having various signal formats. For example, directing attention to the pin electronics circuit PE1 connected to the first pin P1, if the pin electronics circuit PE1 is capable of acquiring (latching) the data signal D1 ($D1_1$) input to the first pin P1 to which it is connected, according to a clock signal that can be switched between the clock signal CLK1 input to the second pin P2 and the clock signal input to the third pin, such a test apparatus supports both the DUTs shown in FIGS. 1A and 1B, which is convenient.

SUMMARY OF THE INVENTION

An embodiment of the present invention has been made in order to address such a need. Accordingly, it is an exemplary purpose of the present invention to provide a data latch circuit (interface circuit) which is capable of acquiring data from various kinds of DUTs having various kinds of signal formats.

An embodiment of the present invention relates to a data latch circuit. The data latch circuit comprises: a data input terminal configured to receive, as an input signal, a serial-format data signal; n (n represents an integer of two or more) clock input terminals each configured to receive a clock signal as an input signal; n input flip-flops respectively arranged for the n clock input terminals, and each configured to latch the data signal at a timing that corresponds to the corresponding clock signal; n serial/parallel converters respectively arranged for the aforementioned n clock input terminals, and each configured to convert the serial-format data signal into intermediate parallel-format data using the corresponding clock signal; and a data selector configured to select one from among the aforementioned n intermediate data according to a selection signal.

Such an embodiment allows the data input via the data input terminal to be latched using one desired clock signal selected from among the multiple clock signals.

In general, when an electrical signal passes through a selector, jitter is superimposed on the electrical signal. With the embodiment, a clock signal does not pass through the selector. Instead, intermediate data having a frequency reduced by the serial/parallel conversion passes through the selector. That is to say, there is a less severe timing requirement for such intermediate data to be passed through the selector. As a result, the effects of jitter become relatively small as compared with an arrangement in which a high-speed clock signal passes through the selector. Thus, such an arrangement allows high-speed data to be latched in a sure manner.

Also, a data latch circuit according to an embodiment may further comprise n retiming circuits respectively arranged for the aforementioned n clock input terminals, and each configured to perform retiming of the corresponding intermediate data using an internal clock signal. Also, the data selector may be configured to select, according to a selection signal, one from among the n intermediate data subjected to retiming.

such an arrangement allows an upstream stage of the data selector to synchronize the received data with the internal clock on the receiver circuit side.

Also, a data latch circuit according to an embodiment may further comprise m frequency dividers respectively arranged for the aforementioned n clock input terminals, and each configured to divide the frequency of the corresponding clock signal by m (m represents an integer of two or more) so as to generate an intermediate clock signal. Also, each of the n retiming circuits may include FIFO (First In First Out) memory. Also, each FIFO memory may be configured to allow the corresponding intermediate data to be written in synchronization with the corresponding intermediate clock signal, and to allow the corresponding intermediate data thus written to be read out in synchronization with the internal clock signal.

Also, a data latch circuit according to an embodiment may further comprise an output flip-flop configured to latch the output data of the data selector in synchronization with an internal clock signal.

Also, a data latch circuit according to an embodiment may further comprise: m frequency dividers respectively arranged for the aforementioned n clock input terminals, and each configured to divide the frequency of the corresponding clock signal by m (m represents an integer of two or more) so as to generate an intermediate clock signal; a clock selector configured to select, according to the selection signal, one from among the m intermediate clock signals output from the m frequency dividers; and an output flip-flop configured to latch the output data of the data selector in synchronization with the intermediate clock signal selected by the clock selector.

With such an embodiment, a frequency-divided intermediate clock signal passes through the clock selector. As a result, such an arrangement is capable of latching the data signal using a desired clock signal while reducing the effects of jitter that occurs in the selector.

Another embodiment of the present invention relates to a test apparatus. The test apparatus comprises any one of the aforementioned data latch circuits.

Such an embodiment is capable of testing various kinds of devices under test, having various kinds of output formats.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

Figure 2:
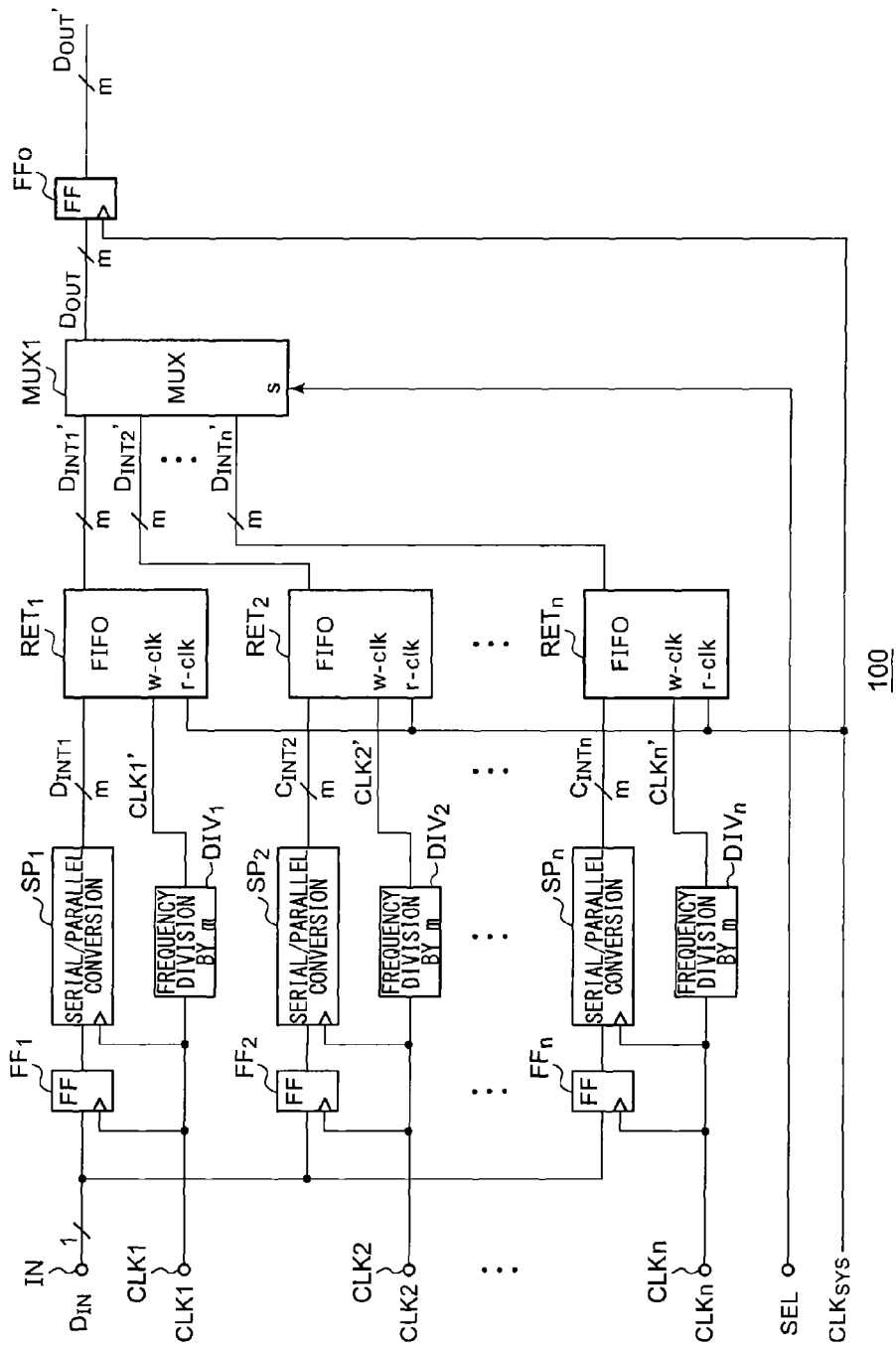
FIG. 2 is a circuit diagram which shows a configuration of a data latch circuit according to an embodiment.

FIG. 2 is a circuit diagram which shows a data latch circuit 100 according to an embodiment. First, description will be made regarding the overall functions of the data latch circuit 100.

The data latch circuit 100 has an input terminal IN and n (n represents an integer of 2 or more) multiple clock input terminals CLK1 through CLKn. The input terminal IN receives, as an input signal, an m-bit (m represents an integer of two or more) data signal $D_{IN}$ in a bit-serial format. Clock signals CLK1 through CLKn are input to the multiple clock input terminals CLK1 through CLKn, respectively. A selection signal SEL indicates which of the multiple clock signals CLK1 through CLKn is synchronized with the data signal $D_{IN}$.

The data latch circuit 100 uses one clock signal, which is selected from among the multiple clock signals CLK1 through CLKn, that is synchronized with the data signal $D_{IN}$ to convert the data signal $D_{IN}$ into a parallel signal. Furthermore, the data latch circuit 100 outputs an output data signal $D_{OUT}$ that is synchronized with an internal synchronization system clock $CLK_{SYS}$. The above is the function of the data latch circuit 100.

In order to provide such a function, the data latch circuit 100 includes n input flip-flops $FF_1$ through $FF_n$, n serial/parallel converters $SP_1$ through $SP_n$, n frequency dividers $DIV_1$ through $DIV_n$, and $n$ retiming circuits $RET_1$ through $RET_n$, provided to the multiple respective clock input terminals CLK1 through CLKn. Furthermore, the data latch circuit 100 includes a data selector (multiplexer) MUX1 and an output flip-flop FFo.

The input flip-flop $FF_1$ through $FF_n$ respectively latch the data signal $D_{IN}$ at timings that correspond to the respective clock signals CLK1 through CLKn. Specifically, the i-th input flip-flop FFi latches the data signal $D_{IN}$ at the timing of the positive edge (and/or negative edge) of the i-th clock signal CLKi. Each input flip-flop FF can be configured using a flip-flop circuit, latch circuit, etc. The configuration of the input flip-flop FF is not restricted in particular.

The serial/parallel converters $SP_1$ through $SP_n$ respectively convert the serial data signal $D_{IN}$ into parallel-format intermediate data signals $D_{INT1}$ through $D_{INTn}$ using the respective clock signals CLK1 through CLKn. Specifically, the i-th serial/parallel converter $SP_i$ performs serial/parallel conversion of the data signal $D_{IN}$ using the i-th clock signal CLKi. The intermediate data signals $D_{INT1}$ through $D_{INTn}$ each have a frequency that is 1/m times the frequency of the original data signal $D_{IN}$.

The intermediate data signals $D_{INT1}$ through $D_{INTn}$ generated by the serial/parallel converters $SP_1$ through $SP_n$ are input to the data selector MUX1 via the retiming circuits $RET_1$ through $RET_n$.

The retiming circuits $RET_1$ through $RET_n$ perform retiming of the respective intermediate data signals $D_{INT1}$ through $D_{INTn}$ using the system clock $CLK_{SYS}$. Each retiming circuit RET shown in FIG. 2 is configured as FIFO (First In First Out) memory. The frequency dividers $DIV_1$ through $DIV_n$ respectively divide the frequencies of the corresponding clock signals CLK1 through CLKn by m, thereby generating clock signals CLK1' through CLKn' thus frequency-divided.

The i-th intermediate data signal $DINT_i$ is input to the data terminal of the i-th FIFO memory $RET_i$, and the corresponding frequency-divided clock signal $CLKi'$ is input to a write clock terminal w-clk thereof. The system clock $CLK_{SYS}$ is input to a read clock terminal r-clk thereof. The retiming circuits $RET_1$ through $RET_n$ respectively output the intermediate data signals $D_{INT1}'$ through $D_{INTn}'$ thus subjected to retiming using the system clock $CLK_{SYS}$.

The data selector MUX1 selects one intermediate data signal from among the multiple intermediate data signals $D_{INT1}'$ through $D_{INTn}'$ according to the selection signal SEL. The data thus selected by the data selector MUX1 is data obtained by receiving the data signal $D_{IN}$ using one appropriate clock signal selected from among the multiple clock signals CLK1 through CLKn.

The output flip-flop FFo latches the output data signal $D_{OUT}$ of the data selector MUX1 at an edge timing of the system clock $CLK_{SYS}$, and generates an output data signal $D_{OUT}'$ that is synchronized with the system clock $CLK_{SYS}$.

The above is the configuration of the data latch circuit 100.

The data latch circuit 100 latches the data signal $D_{IN}$ using all the clock signals CLK1 through CLKn, and selects one intermediate data signal from among the multiple intermediate data signals $D_{INT1}$ through $D_{INTn}$ thus obtained, according to the selection signal SEL. Thus, such an arrangement is capable of generating data obtained by latching the data signal $D_{IN}$ using an appropriate clock signal CLK.

Figure 3:
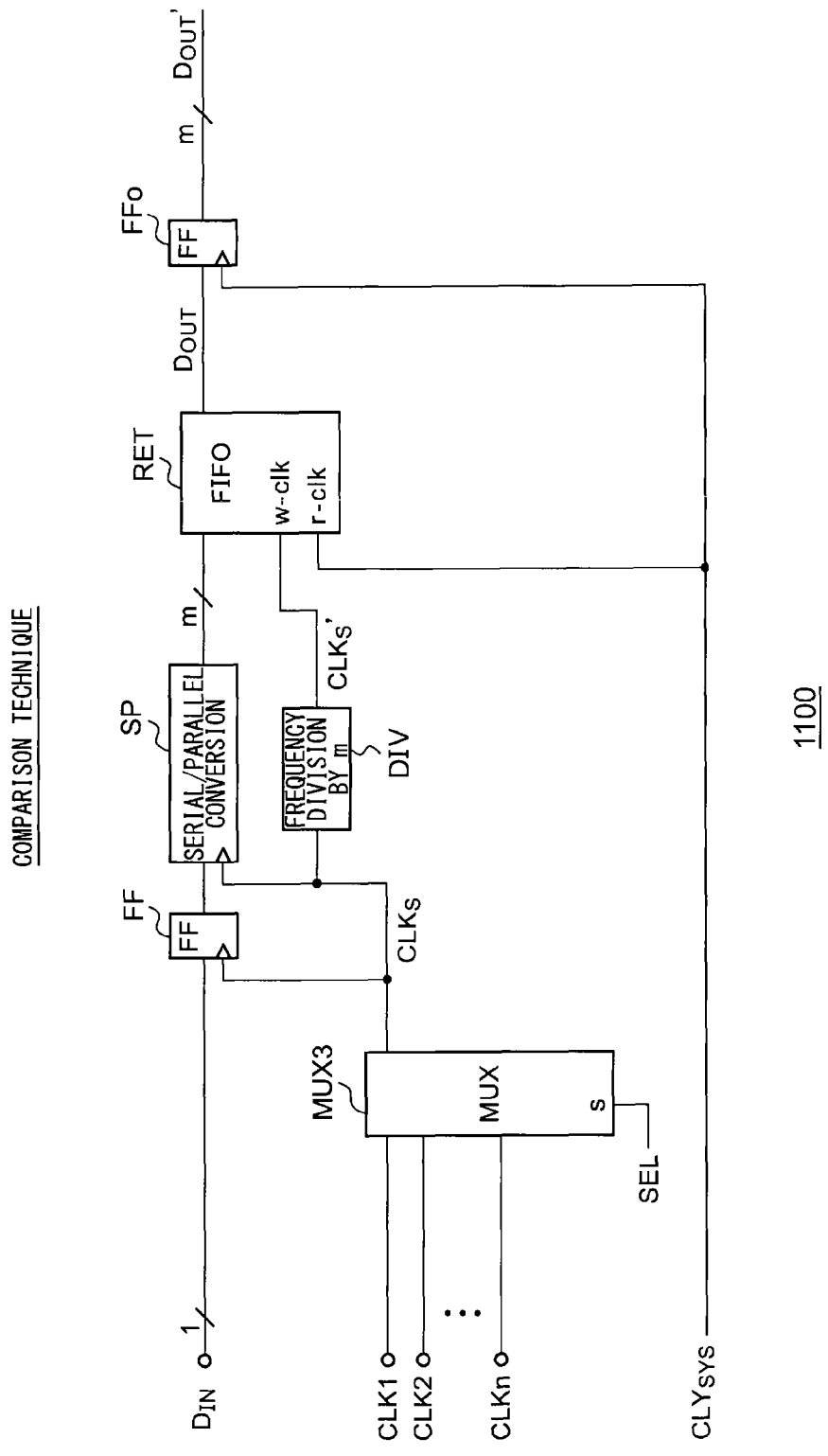
FIG. 3 is a circuit diagram which shows a configuration of a data latch circuit according to a comparison technique.

The advantages of the data latch circuit 100 shown in FIG. 2 can be clearly understood in comparison with a comparison technique shown in FIG. 3. FIG. 3 is a circuit diagram which shows a configuration of a data latch circuit 1100 according to a comparison technique.

The data latch circuit 1100 includes a clock selector MUX3 configured to select one from among the multiple clock signals CLK1 through CLKn according to a selection signal SEL. The clock signal CLKs thus selected by the clock selector MUX3 is a clock signal that is synchronized with the data signal $D_{IN}$.

An input flip-flop FF latches the data signal $D_{IN}$ using the clock signal CLKs thus selected. A serial/parallel converter SP performs serial/parallel conversion of the data signal thus latched by the input flip-flop FF using the clock signal CLKs thus selected, so as to generate an intermediate data signal $D_{INT}$. A frequency divider DIV divides the frequency of the selected clock signal CLKs by m. The clock signal CLKs' thus frequency-divided is synchronized with the parallel-format intermediate data $D_{INT}$. According to a system clock $CLK_{SYS}$, the retiming circuit RET performs retiming of the intermediate data signal $D_{INT}$ that is synchronized with the frequency-divided clock signal CLKs', so as to generate an output data signal Dout. An output flip-flop FFo latches the output data signal Dout using the system clock $CLK_{SYS}$.

The data latch circuit 1100 shown in FIG. 3 provides the same function as that of the data latch circuit 100 shown in FIG. 2. However, the data latch circuit 1100 has the following problem.

With typical selectors (multiplexers), jitter occurs when a signal passes through the selector. In order to allow a flip-flop (D latch) to precisely latch a data signal using a clock signal, there is a need to satisfy the requirements for the setup time and the hold time. As the frequency of the data signal becomes higher, it becomes more difficult to satisfy the requirements for the setup time and the hold time. Accordingly, if jitter is superimposed on a high-speed clock signal after it passes through the selector, the flip-flop FF cannot precisely latch the data signal $D_{IN}$.

The data latch circuit 100 shown in FIG. 2 provides a solution to such a problem as follows.

The data latch circuit 100 shown in FIG. 2 does not use such a selector to perform data acquisition by means of the input flip-flops $FF_1$ through $FF_n$, and to perform serial/parallel conversion by means of the serial/parallel converters $SP_1$ through $SP_n$. That is to say, such an arrangement provides signal processing using the original, high precision clock signals CLK1 through CLKn without jitter being superimposed.

The multiple intermediate data signals $D_{INT1}$ through $D_{INTn}$ each pass through the data selector MUX1. However, these intermediate data signals have a reduced frequency that is 1/m times the original frequency after the serial/parallel conversion. Thus, even if the same amount of jitter is superimposed on such an intermediate data signal, such an arrangement is not easily subject to the effects of such jitter. Thus, the data latch circuit 100 shown in FIG. 2 is capable of acquiring the data signal $D_{IN}$ using an appropriate clock signal, while reducing the effects of jitter that occurs in the selector.

Figure 4:
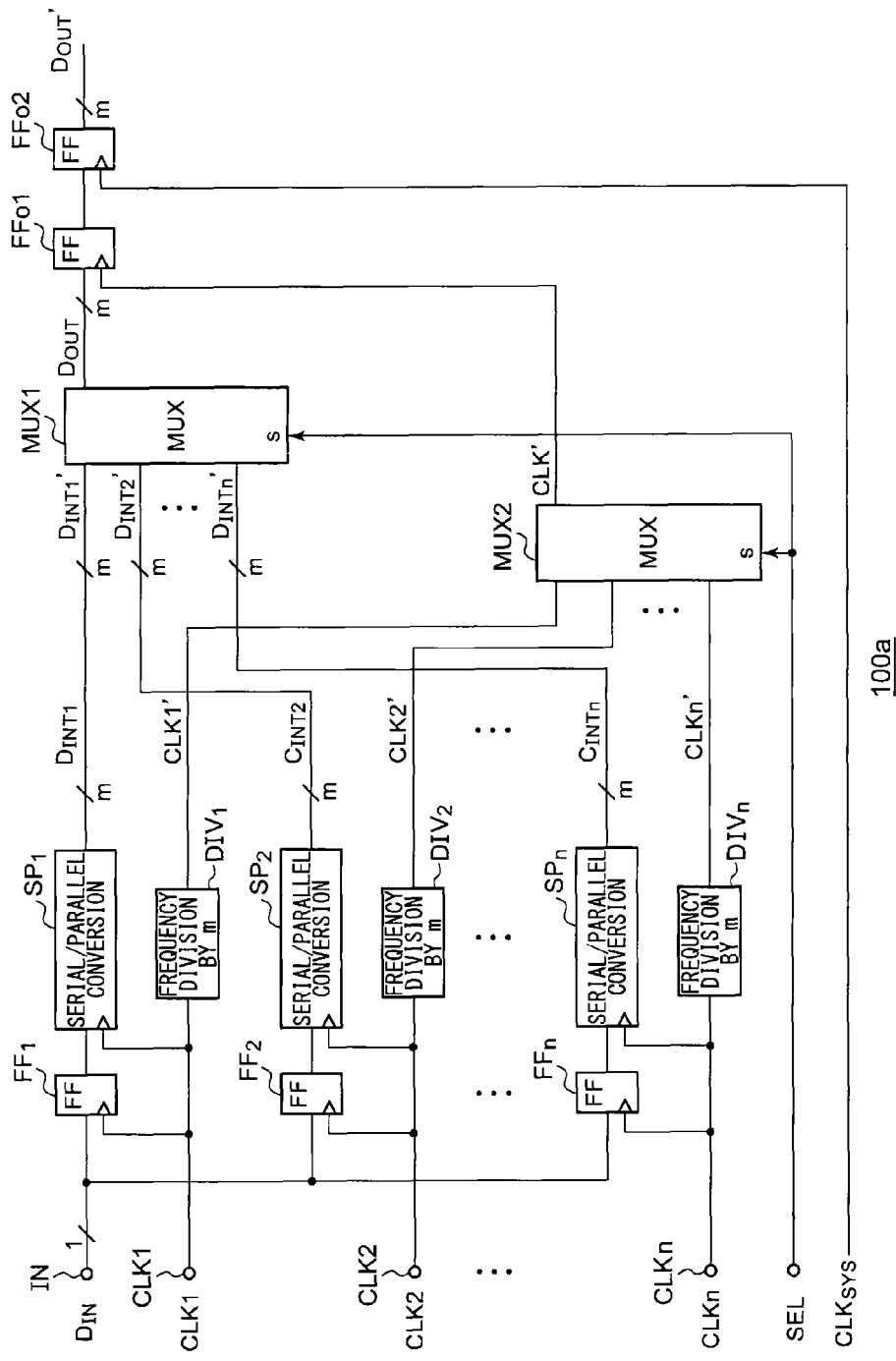
FIG. 4 is a circuit diagram which shows a configuration of a data latch circuit according to a modification.

FIG. 4 is a circuit diagram which shows a data latch circuit 100a according to a modification. Description has been made above regarding the data latch circuit 100 with reference to FIG. 2 configured to change the carrier clock from the external clock signal CLK to the system clock $CLK_{SYS}$ in an upstream stage of the data selector MUX1.

In contrast, the data latch circuit 100a shown in FIG. 4 is configured to change the carrier clock from the external clock signal CLK to the system clock $CLK_{SYS}$ in a downstream stage of the data selector MUX1.

The data selector MUX1 receives the intermediate data $D_{INT1}$ through $D_{INTn}$, and selects one intermediate data signal that corresponds to the selection signal SEL. A clock selector MUX2 receives the multiple frequency-divided clock signals CLK1' through CLKn', and selects one frequency-divided clock signal that corresponds to the selection signal SEL.

An output flip-flop FFo1 latches the output data signal $D_{OUT}$ received from the data selector MUX1 at a timing that corresponds to the clock signal CLK' output from the clock selector MUX2. An output flip-flop FFo2 latches the output data of the output flip-flop FFo1 at a timing that corresponds to the system clock $CLK_{SYS}$.

The data latch circuit 100a shown in FIG. 4 provides the same advantage as that of the data latch circuit 100 shown in FIG. 2.

With the data latch circuit 100a shown in FIG. 4, the output flip-flop FFo1 and FFo2 may be replaced with the FIFO memory shown in FIG. 2. With such an arrangement, the output data signal $D_{OUT}$ of the data selector MUX1 should be input to the data terminal of the FIFO memory, the clock signal CLK' should be input to the write clock terminal w-clk thereof, and the system clock $CLK_{SYS}$ should be input to the read clock terminal r-clk thereof.

Figure 5:
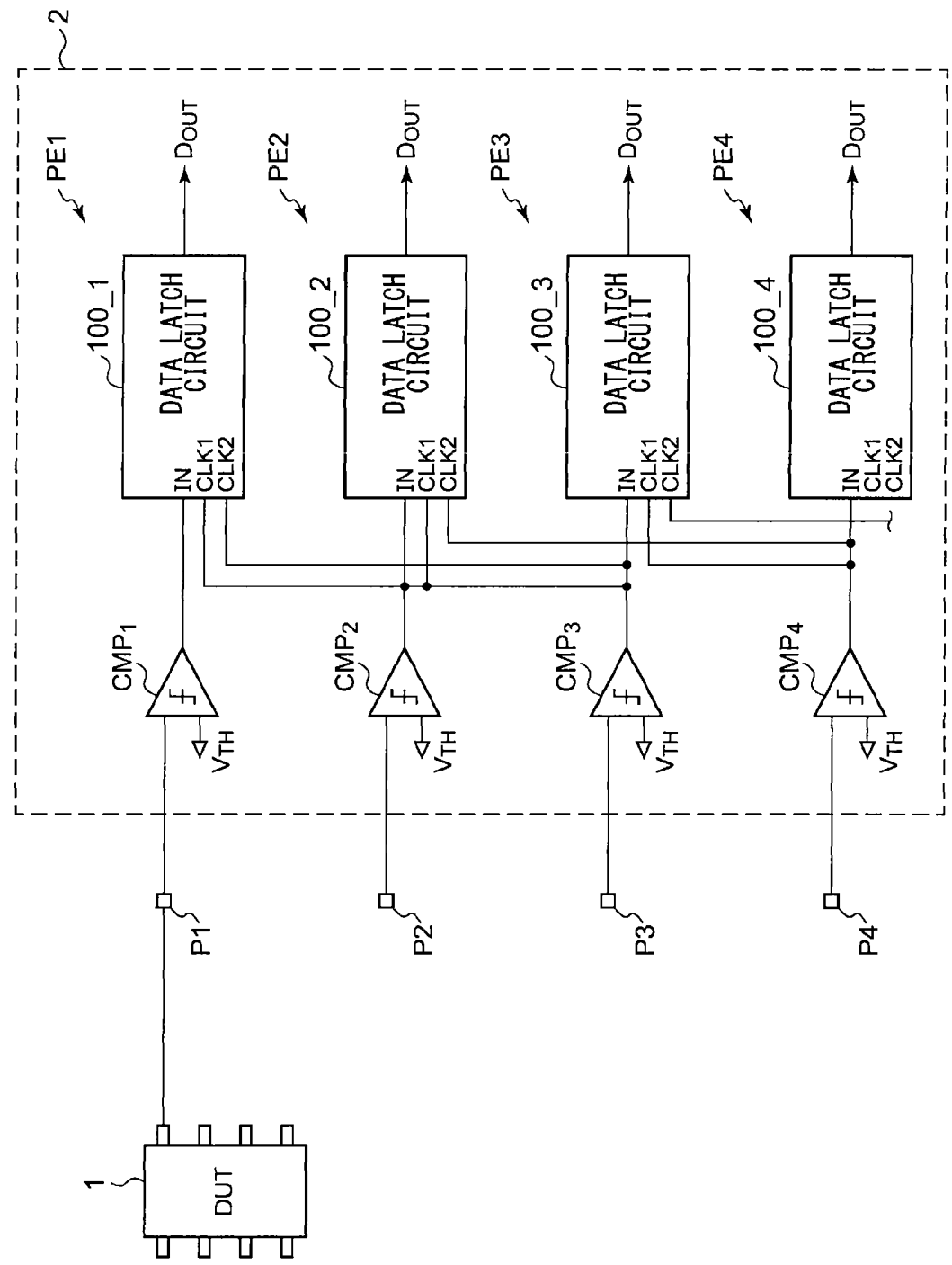
FIG. 5 is a block diagram which shows a configuration of a test apparatus including a data latch circuit according to an embodiment.

Next, description will be made regarding a suitable application of the data latch circuit 100 according to an embodiment. FIG. 5 is a block diagram which shows a configuration of a test apparatus including a data latch circuit according to an embodiment. A test apparatus 2 includes pin electronics circuits PE for each test pin P. FIG. 1 shows only circuit blocks that correspond to the first pin through the fourth pin. Depending on the DUT 1, the signal input to each pin P is either a data signal or a clock signal.

Each pin electronics circuit PE includes a comparator CMP and a data latch circuit 100. The comparator $CMP_i$ compares a data signal or a clock signal thus input to the corresponding pin Pi with a threshold voltage $V_{TH}$, and outputs a signal that corresponds to the comparison result. The data latch circuit 100_i receives, via an input terminal IN thereof, the output signal $D_{IN}$ of the corresponding comparator CMPi. Furthermore, the output data of the comparator $CMP_{i+1}$ that corresponds to the pin P(i+1) is input to the clock input terminal CLK1 of the data latch circuit 100_1. Moreover, the output data of the comparator $CMP_{i+2}$ that corresponds to the pin P(i+2) is input to the clock input terminal CLK2 of the data latch circuit 100_i.

FIG. 5 shows an arrangement in which each data latch circuit 100 includes such two clock input terminals. However, such an arrangement is shown for exemplary purpose only. Which signal is to be input to the clock input terminal of each data latch circuit 100 should be designed giving consideration to the assumed DUT 1.

The above is the configuration of the test apparatus 2.

Figure 1A:
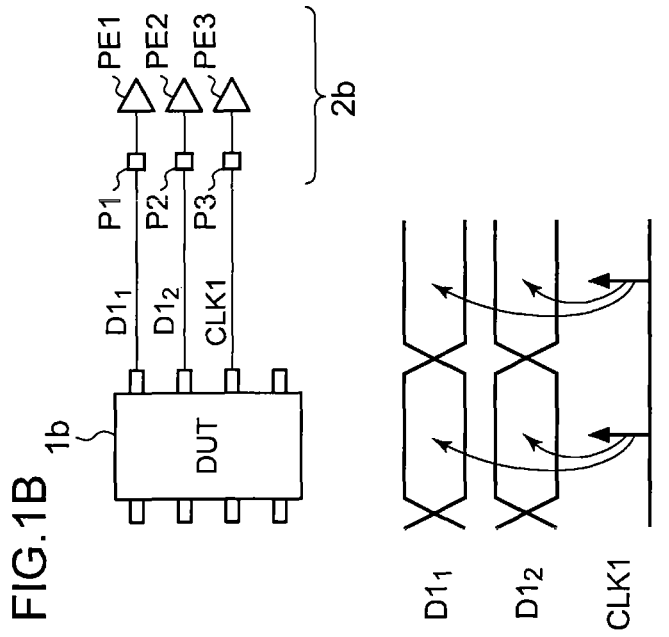
FIGS. 1A and 1B are diagrams each showing an example configuration of a test system.

In the test operation for the DUT 1 shown in FIG. 1A by the test apparatus 2 shown in FIG. 5, the data latch circuit 100_1 latches the data signal $D_{IN}$ using a clock signal of the second pin, input to the first clock input terminal CLK1. Furthermore, the data latch circuit 100_3 latches the data signal $D_{IN}$ using a clock signal of the fourth pin, input to the first clock input terminal CLK1 thereof.

Figure 1B:
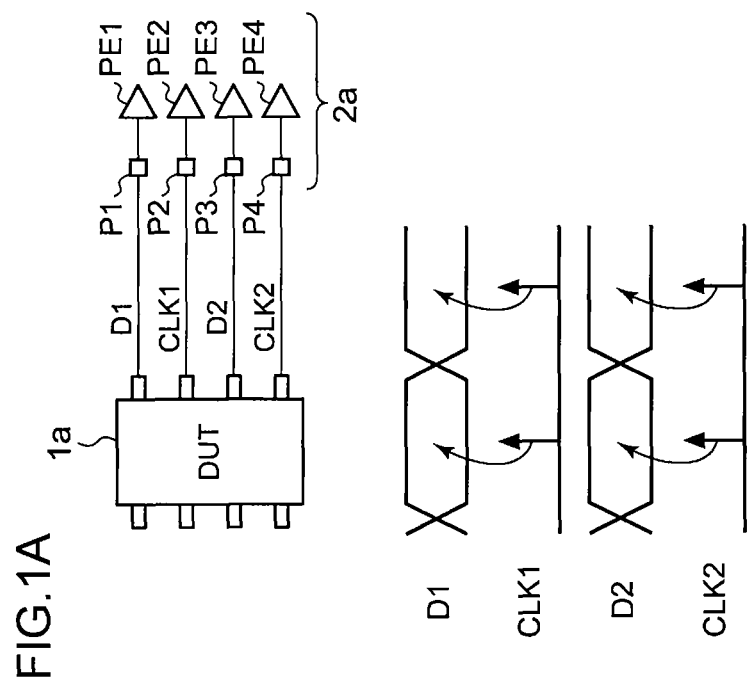

On the other hand, in the test operation for the DUT 1 shown in FIG. 1B by means of the test apparatus 2 shown in FIG. 5, the data latch circuit 100_1 latches the data signal $D_{IN}$ using the clock signal of the third pin, input to the second clock input terminal CLK2 thereof. Furthermore, the data latch circuit 100_2 latches the data signal $D_{IN}$ using the clock signal of the third pin, input to the first clock input terminal CLK1 thereof. In this case, the data latch circuit 100_3 is not used.

As described above, by employing the data latch circuit 100, such an arrangement provides a highly versatile test apparatus 2 which is capable of testing various kinds of DUT 1 having various kinds of output formats.

While the preferred embodiments of the present invention have been described using specific terms, such description is for illustrative purposes only, and it is to be understood that changes and variations may be made without departing from the spirit or scope of the appended claims.

What is claimed is:

1. A data latch circuit comprising:
   a data input terminal configured to receive, as an input signal, a serial-format data signal;
   n (n represents an integer of two or more) clock input terminals each configured to receive a clock signal as an input signal;
   n input flip-flops respectively arranged for the n clock input terminals, and each configured to latch the serial-format data signal at a timing that corresponds to the clock signal at the corresponding clock input terminal;
   n serial/parallel converters respectively arranged for the aforementioned n clock input terminals, and each configured to convert output data of a respective one of the n input flip-flops into intermediate parallel-format data using the corresponding clock signal; and
   a data selector configured to select one from among n intermediate data from the n serial/parallel converters according to a selection signal.

2. A data latch circuit according to claim 1, further comprising n retiming circuits respectively arranged for the aforementioned n clock input terminals, and each configured to perform retiming of the corresponding intermediate data using an internal clock signal,
   wherein the data selector is configured to select, according to a selection signal, one from among the n intermediate data subjected to retiming.

3. A data latch circuit according to claim 2, further comprising m frequency dividers respectively arranged for the aforementioned n clock input terminals, and each configured to divide the frequency of the corresponding clock signal by m (m represents an integer of two or more) so as to generate an intermediate clock signal,
   wherein the n retiming circuits each include FIFO (First In First Out) memory,
   and wherein each FIFO memory is configured to allow the corresponding intermediate data to be written in synchronization with the corresponding intermediate clock signal, and to allow the corresponding intermediate data thus written to be read out in synchronization with the internal clock signal.

4. A data latch circuit according to claim 1, further comprising an output flip-flop configured to latch the output data of the data selector in synchronization with an internal clock signal.

5. A data latch circuit according to claim 1, further comprising:
   m frequency dividers respectively arranged for the aforementioned n clock input terminals, and each configured to divide the frequency of the corresponding clock signal by m (m represents an integer of two or more) so as to generate an intermediate clock signal;
   a clock selector configured to select, according to the selection signal, one from among the m intermediate clock signals output from the m frequency dividers; and
   an output flip-flop configured to latch the output data of the data selector in synchronization with the intermediate clock signal selected by the clock selector.

6. A test apparatus comprising a data latch circuit according to claim 1.

7. A pin electronics circuit comprising:
   a plurality of comparators; and
   a plurality of data latch circuits respectively provided for the plurality of comparators;
   wherein each data latch circuit comprises,
      a data input terminal configured to receive an output signal of respective one of the plurality of comparators,
      n clock input terminals each configured to receive an output signal of one of the plurality of comparators, where n represents an integer of two or more;
      n input flip-flops respectively arranged for the n clock input terminals, and each configured to latch a signal received via the data input terminal at a timing that corresponds to the corresponding clock signal;
      n serial/parallel converters respectively arranged for the aforementioned n clock input terminals, and each configured to convert an output signal having serial format of respective one of the n input flip-flops into intermediate parallel-format data using the corresponding clock signal; and
      a data selector configured to select one from among n intermediate data from the n serial/parallel converters according to a selection signal.

8. A test apparatus comprising a pin electronics circuit according to claim 7.

* * * * *